United States Patent
Priel et al.

(10) Patent No.: US 9,547,028 B2
(45) Date of Patent: Jan. 17, 2017

(54) ELECTRONIC DEVICE AND METHOD

(75) Inventors: Michael Priel, Netanya (IL); Dov Tzytkin, Ness Zyiona (IL); Sergey Sofer, Rishon Lezion (IL)

(73) Assignee: NXP USA, INC., Austin, TX (US)

(*) Notice: Subject to any disclaimer, the term of this patent is extended or adjusted under 35 U.S.C. 154(b) by 734 days.

(21) Appl. No.: 14/009,934

(22) PCT Filed: Apr. 20, 2011

(86) PCT No.: PCT/IB2011/051728
§ 371 (c)(1),
(2), (4) Date: Oct. 4, 2013

(87) PCT Pub. No.: WO2012/143759
PCT Pub. Date: Oct. 26, 2012

(65) Prior Publication Data
US 2014/0032139 A1    Jan. 30, 2014

(51) Int. Cl.
  *G01R 21/06* (2006.01)
  *G01R 21/133* (2006.01)
  (Continued)

(52) U.S. Cl.
  CPC .............. *G01R 21/133* (2013.01); *G06F 1/10* (2013.01); *G06F 1/28* (2013.01); *G06F 1/30* (2013.01);
  (Continued)

(58) Field of Classification Search
  CPC ............ H01L 2924/00014; H01L 2924/01026; H01L 2924/01027; H01L 2924/01028; H01L 2224/13655; H01L 2924/014; H01L 2224/13611; A61B 5/11; A61B 5/7278; A61B 1/00009; A61B 1/04; A61B 2503/06; A61B 2505/09; A61B 5/0006; A61B 5/0077; A61B 5/02108; A61B 5/024; A61B 5/02416; A61B 5/029; A61B 5/0452; A61B 5/0476
  See application file for complete search history.

(56) References Cited

U.S. PATENT DOCUMENTS 7,882,458 B2   2/2011   Tamaki et al.
7,900,172 B2   3/2011   Niitsuma et al.
(Continued)

FOREIGN PATENT DOCUMENTS

JP    2007-034669 A    2/2007

OTHER PUBLICATIONS

F. Jumel et al: "A Leakage Management System Based on Clock Gating Infrastructure for a 65-nm Digital Base-Band Modem Chip", VLSI Circuits, 2006. Digest of Technical Papers. 2006 Symposium, pp. 214-215.

(Continued)

Primary Examiner — Roy Y Yi

(57) ABSTRACT

An electronic device comprises one or more functional units, each functional unit being clocked by a respective clock signal. The electronic device further comprises a monitoring unit for providing a real-time estimate of an electrical current consumed by the functional units. The monitoring unit provides the real-time estimate on the basis of characteristic signals. The characteristic signals may comprise one or more of said clock signals, or one or more clock generating signals used to generate said clock signals. The electronic device may further comprise a power regulator responsive to the real-time estimate. A method of estimating in real-time an electrical current consumed by one or more functional units is also described.

15 Claims, 8 Drawing Sheets

(51) Int. Cl.
*G06F 1/10* (2006.01)
*G06F 1/28* (2006.01)
*G06F 1/30* (2006.01)
*G06F 1/32* (2006.01)

(52) U.S. Cl.
CPC .......... *G06F 1/3237* (2013.01); *Y02B 60/1221* (2013.01)

(56) References Cited

U.S. PATENT DOCUMENTS

| | | |
|---|---|---|
| 2003/0050737 A1 | 3/2003 | Osann |
| 2008/0307244 A1 | 12/2008 | Bertelsen et al. |
| 2008/0312857 A1 | 12/2008 | Sequine |
| 2010/0077242 A1* | 3/2010 | Nishida .................. G06F 1/3203 713/322 |
| 2010/0162018 A1 | 6/2010 | Subramanian et al. |

OTHER PUBLICATIONS

International Search Report and Written Opinion correlating to PCT/IB2011/051728 dated Dec. 28, 2011.

* cited by examiner

ELECTRONIC DEVICE AND METHOD

FIELD OF THE INVENTION

This invention relates to an electronic device and a method.

BACKGROUND OF THE INVENTION

Clock disabling provides an effective method of dynamic power saving in an electronic device. The technique may, however, cause sudden changes in the electrical current drawn by the electronic device, which may, in turn, cause variations of the supply voltage applied across the electronic device. It can be necessary or advantageous to maintain a supply voltage level that fluctuates as little as possible.

U.S. Pat. Nos. 7,882,458 and 7,900,172 describe methods of analyzing power consumption of a simulated electronic device in a design phase before manufacture.

SUMMARY OF THE INVENTION

The present invention provides an electronic device and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Figure 1:
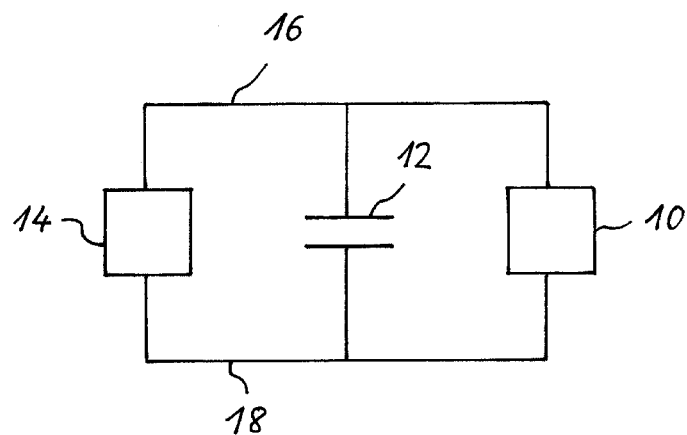
FIG. 1 schematically shows an example of an embodiment of an electronic device in conjunction with a power supply and a bypass capacitor.

FIG. 1 schematically shows an example of an embodiment of an electronic device 10 coupled to a power supply 14. Electronic device 10 may, for example, be a portable device, e.g. a mobile phone or mobile computer. Power supply 14 may be operated to apply an electrical voltage across electronic device 10 in order to power electronic device 10. In the example, power supply 14 may be arranged to apply a first supply voltage level to electronic device 10 via a first conductor 16 and to apply a second supply voltage level to electronic device 10 via a second conductor 18. A bypass capacitor 12 may be coupled parallel to electronic device 10 to reduce short time variations in the voltage across electronic device 10 which may occur, for example, in response to sudden variations in the current drawn by electronic device 10.

It may be desirable to suppress such voltage variations more severely or use a bypass capacitor having a reduced capacitance.

Figure 2:
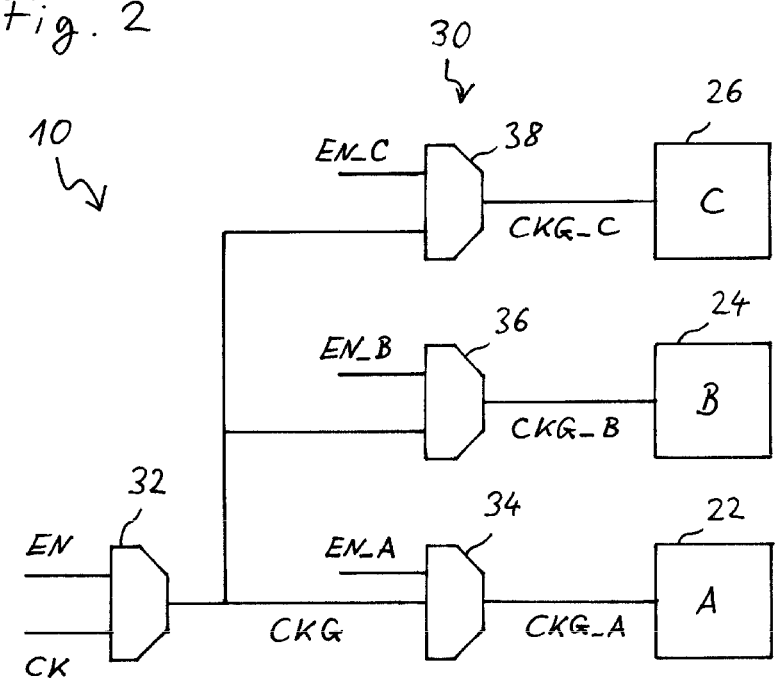
FIG. 2 schematically shows an example of an embodiment of an electronic device comprising functional units clocked via a clock distribution network, comprising, for instance, an ability to disable clock toggling in root and/or in one or more network leafs.

FIG. 2 schematically illustrates an example of an embodiment of an electronic device, e.g. the electronic device 10 introduced above in reference to FIG. 1. Electronic device 10 may comprise one or more functional units. In the shown example, electronic device 10 comprises functional units 22, 24 and 26. Generally, electronic device 10 may, however, comprise an arbitrary number of functional units. For example, a Very Large Scale Integration (VLSI) circuit may comprise tens of thousands of functional units. Each of said functional units may be arranged to be clocked by a respective clock signal. In the example, functional units 22, 24 and 26 may be clocked by clock signals CKG_A, CKG_B and CKG_C, respectively. The functional units may thus be synchronized relative to each other.

Electronic device 10 may comprise a clock distribution network 30 for providing each of the functional units (in the present example, units 22, 24 and 26) with a respective clock signal. Clock distribution network 30 may be a clock tree. The electronic device 10 may be operable to disable clock toggling in root and/or in one or more selected network leafs. In the example, clock distribution network 30 may comprise clock gates 32, 34, 36 and 38. Clock distribution network 30 may comprise further components (not shown) such as level shifters, signal shapers, boosters, or delay elements. In the present example, clock distribution network 30 may generate clock signals CKG_A, CKG_B and CKG_C from an input clock signal CK. Clock signal CK may, for instance, be a root clock signal. For example, clock signal CK may be generated by a clock generator (not shown). The clock generator may be part of the electronic device 10. Alternatively, electronic device 10 may be arranged to receive clock signal CK from a separate device.

Figure 3:
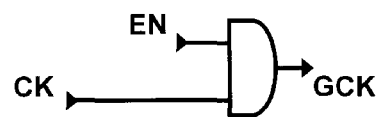
FIG. 3 schematically shows an example of an embodiment of a clock gate.

The clock gates shown in FIG. 2 are described further by way of example in reference to FIG. 3.

FIG. 3 schematically shows an example of an embodiment of a clock gate. The clock gate may, for example, be an AND gate. The clock gate may receive as input signals a clock signal CK and an enable signal EN and generate an output signal GCK on the basis of input clock signal CK and enable signal EN. When enable signal EN indicates a first value, e.g. 1, the clock gate may transfer clock signal CK. In this case, the output clock signal GCK may be substantially equal to the input clock signal CK. When enable signal EN indicates a second value, e.g. 0, the clock gate may block the input clock signal CK. In this case, the output clock signal GCK may indicate a constant value, e.g. zero. Enable signal EN is an example of a clock gate control signal. A clock gate control signal is a signal for controlling a clock gate.

Figure 4:
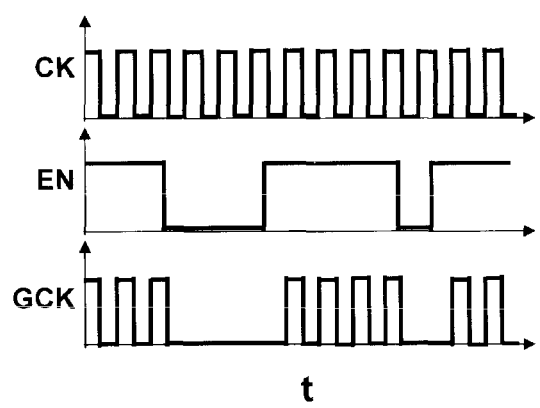
FIG. 4 schematically shows an example of a clock signal waveform, an enable signal waveform, and a resulting gated clock signal waveform as functions of time.

FIG. 4 illustrates by way of example an input clock signal CK and an enable signal EN as may be fed, for example, to the clock gate shown in FIG. 3. The figure further illustrates an output clock signal GCK as may be generated by the clock gate in response to input clock signal CK and enable signal EN. In the example, input clock signal CK may be a square wave. Clock signal CK may alternatively be, for example, a succession of Gaussian pulses or a sinusoidal wave. In any case, input clock signal CK may comprise a succession of rising and falling edges. Each rising edge may be succeeded by a falling edge. In the example, output clock signal GCK equals input clock signal CK for times t at which enable signal EN assumes level 1 (high). In contrast, when enable signal EN assumes level 0 (low), output clock signal GCK may invariably assume level 0 (low). In other words, the clock gate may block or pass the input clock signal CK as a function of the enable signal EN. It is noted that a clock gate may be operated as a clock rate divider.

Referring back to FIG. 2, input clock signal CK may be fed to a first clock gate 32. Clock gate 32 may transfer or block clock signal CK depending on a first enable signal EN which may be fed to clock gate 32. Clock gate 32 may thus generate a gated clock signal CKG. Gated clock signal CKG may be fed to each or selected ones of clock gates 34, 36 and 38. Each of the clock gates 34, 36 and 38 may be controlled by enable signals EN_A, EN_B, EN_C, respectively. Clock gates 34, 36 and 38 may generate the gated clock signals CKG_A, CKG_B and CKG_C, respectively. In the example, in order to feed clock signal CK to functional unit 22, both clock gates 32 and 34 may need to be enabled by means of enable signals EN and EN_A, respectively. Similarly, in order to feed clock signal CK to functional units 24 and 26, clock gates 32, 36 and 38 may need to be enabled by means of enable signals EN, EN_B and EN_C, respectively. Functional units 22, 24 and 26 may be cut from clock signal CK by disabling, for example, clock gate 32. A selected one of functional units 22, 24 and 26 may be cut from clock signal CK by disabling the clock gate associated with the respective unit. For example, clock signal CK may be fed to only the functional units 22 and 24 but not to functional unit 26 when clock gates 32, 34 and 36 are enabled while only clock gate 38 is disabled.

The clock distribution network 30 may thus be used to provide each of one or more functional units with a gated clock signal. The use of gated clock signals (clock gating) may allow achieving substantial power savings. For example, when one of the functional units 22, 24, 26 is idle or its operation is not required, the unit in question may be cut off from input clock signal CK. In other words, the clock rate of the gated clock signal received by the respective unit (e.g., clock signal CKG_A received by functional unit 22) may be reduced to zero. The dynamic power consumption of the functional unit can thus be reduced. The dynamic power consumption is understood to be the power required for switching operations performed by the functional unit. As the number of switching operations tends to be proportional to the clock rate, the dynamic power consumption may be reduced to zero (in the best case) by disabling the respective clock signal (e.g., gate clock signal CKG_A), i.e. by reducing the clock rate to zero.

Disabling the clock signal for a specific functional unit or for a group of functional units may cause a rapid short-term change in the electrical current drawn by the electronic device 10. An electronic device that is operable to predict or estimate its electrical current consumption and to control its power supply to adapt the power supply's electrical current drive capability is therefore proposed.

Therefore, an electronic device with real-time electrical current estimation capability is provided. The electronic device may comprise one or more functional units. Each of these functional units may be arranged to be clocked by a respective clock signal. The electronic device may further comprise a monitoring unit for providing a real-time estimate of an electrical current consumed by the functional units. The monitoring unit may be operable to provide the real-time estimate on the basis of characteristic signals. The characteristic signals may comprise one or more of said clock signals. Alternatively or additionally, the characteristic signals may comprise one or more clock generating signals used to generate the clock signals. The clock generating signals may, for example, comprise one or more clock network control signals (clock gating control signals), as will be described further below. The electronic device may further comprise a power regulator responsive to the real-time estimate provided by the monitoring unit.

The clock generating signals may comprise one or more operating mode signals. Each of these operating mode signals may indicate an operating mode of a respective functional unit and may be used to generate a set of or more clock gating signals associated with the respective operating mode. For example, a Digital Signal Processor (DSP) core may include a multiplier, an accumulator and a bit field operating unit. In a first operating mode, the multiplier, the accumulator, and the bit field operating unit may all be operating. In a second operating mode, only e.g. the multiplier may be operating, whereas the other functional units may be idle. Thus the corresponding clock gating signals may be disabled.

The electronic device may comprise a clock distribution network for providing each of said functional units with a respective clock signal. In this case, said clock generating signals may comprise one or more clock network control signals for controlling the clock distribution network. The clock network control signals may be generated, for example, in accordance with the flow of an application that is being executed by the electronic device. The clock distribution network may comprise one or more clock gates. In this case, the clock network control signals may comprise one or more clock gate control signals for controlling the clock gates. One or more of the clock gates may be operable as clock rate dividers.

Figure 5:
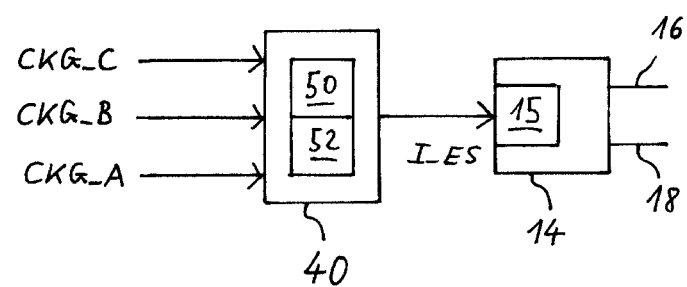
FIG. 5 schematically shows an example of an embodiment of a circuit activity monitoring unit coupled to a power regulator.

Referring now to FIG. 5, the monitoring unit may be operable to provide a real-time estimate of a consumed electrical current on the basis of clock rates of said clock signals. FIG. 5 schematically shows an example of embodiment of a monitoring unit 40 providing a monitoring signal I_ES to a current regulator 15. Monitoring signal I_ES may represent a real-time estimate of an electrical current consumed by functional units of an electronic device. The electronic device may, for example, be electronic device 10 described above in reference to FIGS. 1 and 2. Monitoring unit 40 may be integrated in the electronic device. Current regulator 15 may be operable to control an output voltage provided by a power supply, e.g. power supply 14, for powering the electronic device. The output voltage may thus be adapted rapidly, e.g., quasi instantly, to the electrical current drawn by the electronic device. Current regulator 15 may be integrated in power supply 14.

In the shown example, monitoring unit 40 may receive as input signals one or more clock signals, e.g., gated clock signals, which may clock the functional units of the electronic device. These clock signals may, for example, comprise the gated clock signals CKG_A, CKG_B and CKG_C associated with functional units 22, 24 and 26, respectively, as described above in reference to FIG. 2. Monitoring unit 40 may be operable to generate the monitoring signal I_ES on the basis of the input clock signals, for example, gated clock signals CKG_A, CKG_B and CKG_C. Monitoring unit 40 may, for instance, provide the real-time estimate of the consumed electrical current on the basis of clock rates of the input clock signals.

The clock rate of a (gated or non-gated) clock signal may be defined as the number of triggering edges per unit time, e.g., per second. A triggering edge is an edge that triggers a switching operation of the device clocked by the clock signal. Triggering edges may be only rising edges, or only falling edges, or both rising edges and falling edges of a clock signal. The clock rate may be defined quasi-instantly, e.g. as 1 divided by the time between two consecutive triggering edges.

The monitoring unit may be operable to calculate electrical currents of the functional units by means of a look-up table, for example, on the basis of clock signal rates or states of clock gating control signals. The monitoring unit may comprise a look-up table container and a logic unit. The look-up table container may, for example, be provided by a non-volatile memory or by dedicated circuitry. The look-up table container may comprise the look-up table. The look-up table may comprise one or more data entries. The logic unit may be operable to select one or more of these data entries on the basis of one or more of the characteristic signals and generate a real-time estimate of a consumed electrical current on the basis of the selected data entries. For example, monitoring unit 40 may comprise a memory 50 and a logic unit 52. Logic unit 52 may, for instance, comprise a digital signal processor (DSP). Logic unit 52 may select one or more data entry residing in memory 50 on the basis of one or more of the received input clock signals, e.g., CKG_A, CKG_B and CKG_C. Logic unit 52 may then estimate the consumed electrical current on the basis of the selected data entries.

Logic unit 52 may, for instance, determine clock rate F_A of gated clock signal CKG_A, for example, by counting the number of triggering edges of CKG_A over a suitable time interval. The time interval may, for example, be a suitably defined multiple of one clock cycle of the input clock signal CK described in reference to FIG. 2. For instance, logic unit 52 may count a number of triggering edges of CK and a corresponding number of triggering edges of CKG_A to determine the clock rate of CKG_A. Logic unit 52 may then select a data entry in memory 50 associated with the determined clock rate F_A. The selected data entry may provide a real-time estimate of the electrical current presently consumed by functional unit 22.

Logic unit 52 may similarly estimate, in real-time, electrical currents presently consumed by further functional units of the electronic device, for instance, functional units 24 and 26. Logic unit 52 may sum the thus determined estimates to obtain a real-time estimate of a combined electrical current consumed by the functional units. Monitoring unit 40 may generate monitoring signal I_ES so as to indicate the estimated current consumed by the functional units. Monitoring signal I_ES may, for example, be an analogue signal. Monitoring signal I_ES may, for example, be provided by a voltage level that is varied in accordance with the estimated electrical current. Providing said real-time estimate may thus comprise estimating, for each of said functional units a respective level of an electrical current consumed by the respective functional unit. The electrical current level may be estimated on the basis of one or more of said characteristic signals. The thus estimated levels may be summed. For example, logic unit 52 may comprise an estimation unit (not shown) and an adder (not shown). The estimation unit may be arranged to generate the individual estimates for the various functional units, while the adder may be arranged to sum the thus generated individual estimates. The estimation may take correlations between different functional units into account, if any such correlations are known or expected to exist.

Figure 6:
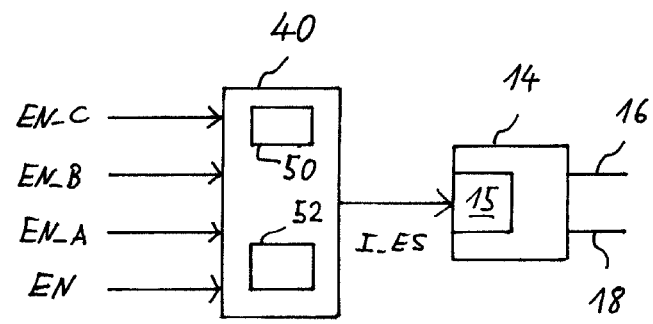
FIG. 6 schematically shows an example of an embodiment of a monitoring unit coupled to a power regulator.

FIG. 6 illustrates another example of an embodiment of monitoring unit 40. Monitoring unit 40 may receive as input signals one or more clock network control signals. A clock network control signal is a signal for controlling a clock distribution network. Clock network control signals may comprise, for example, clock gate control signals. Monitoring unit 40 may generate a monitoring signal I_ES representing a real-time estimate of a consumed electrical current on the basis of the input clock network control signals. In the shown example, the clock network control signals fed to monitoring unit 40 may comprise the clock gate enable signals EN, EN_A, EN_B and EN_C described above in reference to FIG. 2. For instance, monitoring unit 40 may read data entries from memory 50 on the basis of the input clock gate control signals EN, EN_A, EN_B and EN_C. Monitoring unit 40 may then generate the monitoring signal I_ES providing an estimate of an electrical current consumed by the functional units on the basis of the data entry read from memory 50. These operations may be performed or controlled by logic unit 52.

Figure 7:
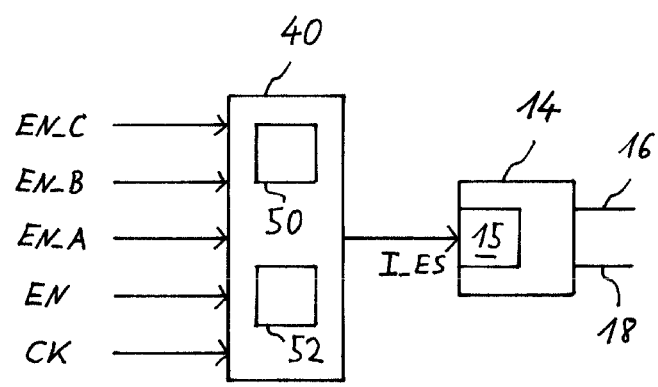
FIG. 7 schematically shows an example of an embodiment of a monitoring unit coupled to a power regulator.

FIG. 7 illustrates another example of an embodiment of a monitoring unit 40. Monitoring unit 40 of the present example may generate the monitoring signal I_ES described above in reference to FIGS. 5 and 6 further on the basis of a clock signal CK of a higher hierarchy level of a clock tree. Clock signal CK may, for instance, be the clock signal CK described above in reference to FIG. 2. Monitoring unit 40 may, for instance, determine clock rates from clock signal CK in conjunction with the input clock gate control signals. Monitoring unit 40 may further operate as described in reference to FIG. 5. The estimated electrical current indicated by monitoring unit 40 may, for instance, be proportional to a clock rate of clock signal CK.

Figure 8:
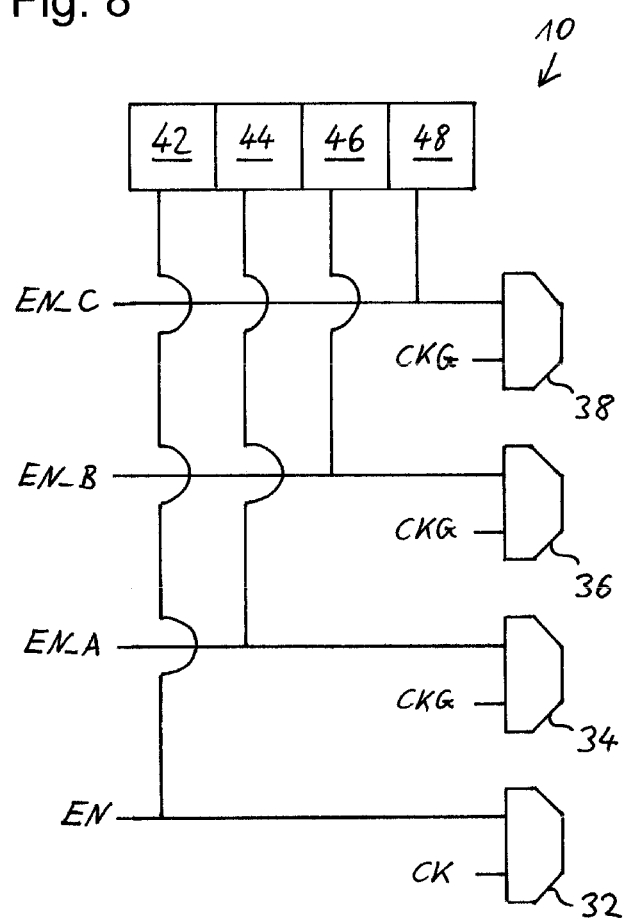
FIG. 8 schematically shows an example of an embodiment of a set of clock gates coupled to a corresponding set of clock gate status bits.

Referring now to FIG. 8, the monitoring unit may comprise one or more clock gate status bits. Each clock gate status bit may be associated with a respective clock gate. Each clock gate status bit may be arranged to assume either a first state or a second state depending on whether the respective clock gate is open or closed. The monitoring unit may be operable to determine a real-time estimate of a consumed electrical current on the basis of the states of the clock gate status bits. In the example of FIG. 8, status bits 42, 44, 46 and 48 may be arranged to indicate the current (i.e. present) values of clock gate enable signals EN, EN_A, EN_B and EN_C, respectively. The status bits may be provided by a register. The status bits' content may then be further processed by monitoring unit 40 described above in reference to FIGS. 5 to 7. The status bits may be integrated in the monitoring unit 40.

Figure 9:
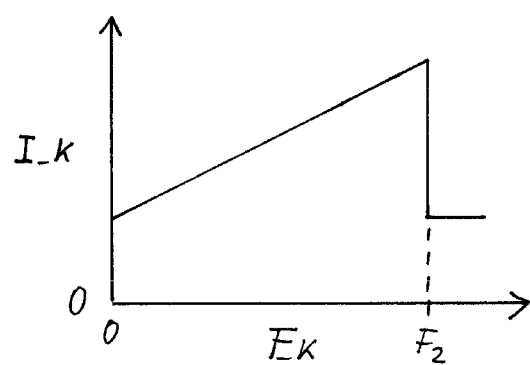
FIG. 9 schematically shows an example of a plot of an estimated electrical current as a function of a clock rate.

FIG. 9 schematically illustrates an estimated electrical current I_k consumed by the k-th functional unit of a set of one or more functional units, as a function of the clock rate F_k at which the k-th functional unit is operated. The functional unit may, for example, be one of functional units 22, 24 and 26 described above. In the present example, the current may increase, e.g. linearly, for clock rates up to a maximum clock rate F2 at which the functional unit may operate correctly. Clock rates higher than F2 may be too high for the functional unit to operate. The nonzero offset for F_k=0 and for F_k>F2 may represent a leakage current. The leakage current may be independent of the clock rate.

Figure 10:
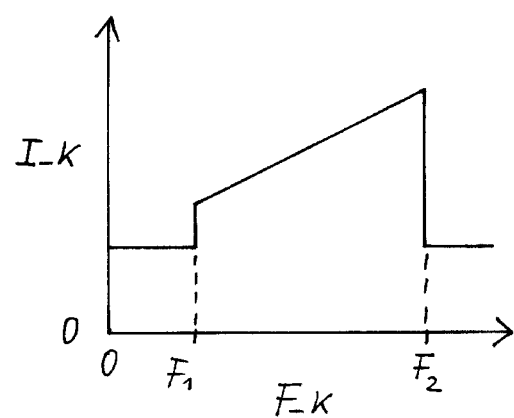
FIG. 10 schematically shows an example of a plot of an estimated electrical current as a function of a clock rate.

FIG. 10 shows a plot of another example of an estimated current consumed by said k-th functional unit. For clock rates in a range from F1 to F2, the estimate electrical current I_k may increase, e.g. in proportion to the clock rate F_k. Clock rates below F1 may be too low, and clock rates above F2 may be too high for the functional unit to operate. The nonzero offset of the estimated current I_k on these intervals may correspond to a leakage current.

The data entries referred to above in reference to FIGS. 5, 6 and 7 may define an estimated electrical current I_k as a function of a clock rate F_k for each or some of the functional units of the electronic device, or for groups of functional units.

The real-time estimate of the consumed electrical current to be provided by the monitoring unit 40 described above may defined at a design stage of the electronic device 10 or at a production stage or at a later software configuration stage. For instance, parameters for generating the real-time estimate may be set during a silicon validation stage.

Figure 11:
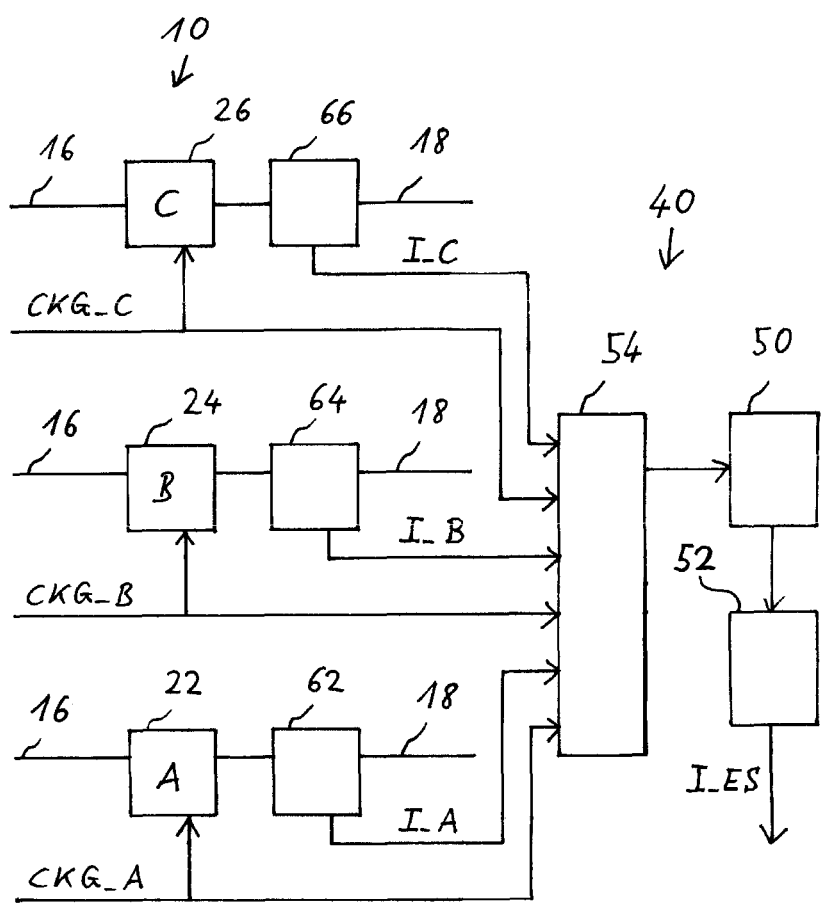
FIG. 11 schematically shows an example of an embodiment of an electronic device comprising a calibration unit.

The monitoring unit may comprise one or more current sensors. Each of these current sensor may be arranged to provide a sensor signal indicative of an electrical current consumed by a functional unit. The monitoring unit may further comprise a calibration unit for updating data entries of the look-up table. The calibration unit may be arranged to update the look-up table on the basis of said characteristic signals and said sensor signals. FIG. 11 shows an example of an embodiment of an electronic device 10 comprising a calibration unit 54 for calibrating the monitoring unit 40. Calibration unit 54 may be integrated in monitoring unit 40. In the present example, electronic device 10 may comprise current sensors 62, 64 and 66. Current sensors 62, 64 and 66 may be operable to measure an electrical current consumed by functional units 22, 24 and 26, respectively. Current sensors 62, 64 and 66 may provide sensors signals I_A, I_B and I_C for indicating the measured currents and feed the sensor signals I_A, I_B and I_C to calibration unit 54. Calibration unit 54 may be operable to receive as further input signals clock-related characteristic signals such as gated or non-gated clock signals or clock network control signals. In the example, functional units 22, 24 and 26 may be clocked by gated clock signals CKG_A, CKG_B and CKG_C, respectively. Gated clock signals CKG_A, CKG_B and CKG_C may be fed to calibration unit 54. Calibration unit 54 may thus calibrate monitoring unit 40 on the basis of sensor signals I_A, I_B, I_C and clock signals CKG_A, CKG_B, CKG_C. Calibration unit 54 may, for instance, set estimated electrical current levels equal to measured electrical current levels. Calibration unit 54 may, for instance, update data entries residing in a memory 50 of monitoring unit 40.

Figure 12:
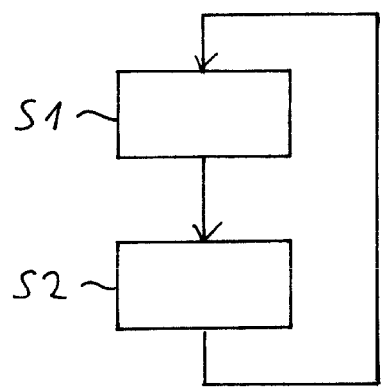
FIG. 12 shows a flow chart of an example of an embodiment of a method.

Referring now to FIG. 12, a method of providing a real-time estimate of an electrical current consumed by a set of one or more functional units is illustrated. Each of the functional units may be clocked by a respective clock signal. The electrical current estimate may be provided in real-time on the basis of one or more characteristic signals. The characteristic signals may comprise one or more of said clock signals or one or more clock generating signals used to generate said clock signals. One or more electrical current data entries of a look-up table may be selected on the basis of one or more of said characteristic signals. The electrical current consumed by the functional units may be estimated on the basis of the selected electrical current data entries. In step S1, one or more clock-related characteristic signals may be fed to a monitoring unit, e.g., monitoring unit 40 described above. In step S2, the monitoring unit may generate, on the basis of said characteristic signals, a monitoring signal representing an estimate of the consumed electrical current. A supply voltage of the electronic device may be controlled on the basis of the estimated electrical current.

In the foregoing specification, the invention has been described with reference to specific examples of embodiments of the invention. It will, however, be evident that various modifications and changes may be made therein without departing from the broader spirit and scope of the invention as set forth in the appended claims.

Any value or quantity may be represented by a signal. Such signal may be analogue or digital.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the clock status bits 42, 44, 46, 48 may be integrated in the monitoring unit 40 or be arranged elsewhere in the electronic device. Power regulator 15 may be merged with power supply 16. The look-up table may be composed of sub-tables. The sub-tables may be located in one physical devices. Alternatively, the sub-tables may be distributed over two or more physical devices.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, clock distribution network 30, memory 50, logic unit 52, and calibration unit 54 may be located on a single integrated circuit. Alternatively, the examples may be implemented as any number of separate integrated circuits or separate devices interconnected with each other in a suitable manner. For example, clock distribution network 30, memory 50, logic unit 52, or calibration unit 54 may be located on separate integrated circuits.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An electronic device, comprising:
   one or more functional units, each of said functional units arranged to be clocked by a respective clock signal; and
   a monitoring unit for providing a real-time estimate of an electrical current consumed by said functional units, said monitoring unit being operable to provide said real-time estimate on the basis of characteristic signals, said characteristic signals include one of a group consisting of:
   one or more of said clock signals, and
   one or more clock generating signals used to generate said clock signals.

2. The electronic device of claim 1, wherein said monitoring unit is operable to provide said real-time estimate on the basis of clock rates of said clock signals.

3. The electronic device of claim 1, comprising a clock distribution network for providing each of said functional units with a respective clock signal, said clock generating signals comprising one or more clock network signals for controlling said clock distribution network.

4. The electronic device of claim 3, said clock distribution network comprising one or more clock gates, said clock network signals comprising one or more clock gate control signals for controlling said clock gates.

5. The electronic device of claim 4, wherein one or more of said clock gates are operable as clock rate dividers.

6. The electronic device of claim 4, said monitoring unit comprising one or more clock gate status bits, each of said clock gate status bits associated with a respective clock gate and arranged to assume either a first state or a second state depending on whether the respective clock gate is open or closed, said monitoring unit being operable to determine said real-time estimate on the basis of the states of said clock gate status bits.

7. The electronic device of claim 1, said monitoring unit comprising:
   an estimation unit for estimating, for each of said functional units a respective level of an electrical current consumed by the respective functional unit, on the basis of one or more of said characteristic signals; and
   an adder for summing the estimated levels to provide said real-time estimate.

8. The electronic device of claim 7, wherein said estimating takes correlations between different functional units into account.

9. The electronic device of claim 1, said monitoring unit comprising a look-up table container and a logic unit, said look-up table container comprising data entries and said logic unit being operable to:
   select one or more of said data entries on the basis of one or more of said characteristic signals; and
   generate said real-time estimate on the basis of the selected data entries.

10. The electronic device of claim 9, the monitoring unit further comprising
   one or more current sensors for providing one or more sensor signals indicative of one or more electrical currents consumed by said functional units, and
   a calibration unit for updating said data entries on the basis of said characteristic signals and said sensor signals.

11. The electronic device claim 1, said clock generating signals comprising one or more operating mode signals, each of said operating mode signals indicating an operating mode of a respective functional unit.

12. The electronic device claim 1, comprising a power regulator responsive to said real-time estimate.

13. A method of providing a real-time estimate of an electrical current consumed by a set of one or more functional units, each of said functional units being clocked by a respective clock signal, said real-time estimate being provided on the basis of one or more characteristic signals, said characteristic signals including one of a group consisting of:
   one or more of said clock signals, and
   one or more clock generating signals used to generate said clock signals.

14. The method of claim 13, comprising:
   selecting one or more electrical current data entries of a look-up table on the basis of one or more of said characteristic signals; and
   providing said real-time estimate on the basis of the thus selected electrical current data entries.

15. The method of claim 13, wherein providing said real-time estimate comprises:
   estimating, for each of said functional units a respective level of an electrical current consumed by the respective functional unit, on the basis of one or more of said characteristic signals; and
   summing the thus estimated levels.

* * * * *